United States Patent
Kamtekar et al.

(10) Patent No.: US 10,392,476 B2
(45) Date of Patent: Aug. 27, 2019

(54) POLYMERS COMPRISING AMINO DIHYDROPHENANTHRENE REPEATING UNITS AND ORGANIC ELECTRONIC DEVICES USING THE SAME

(71) Applicants: Cambridge Display Technology Limited, Godmanchester (GB); Sumitomo Chemical Company Limited, Tokyo (JP)

(72) Inventors: Kiran Kamtekar, Godmanchester (GB); Ruth Pegington, Godmanchester (GB)

(73) Assignees: Cambridge Display Technology Limited, Godmanchester (GB); Sumitomo Chemical Company Limited, Tokyo (JP)

(*) Notice: Subject to any disclaimer, the term of this patent is extended or adjusted under 35 U.S.C. 154(b) by 415 days.

(21) Appl. No.: 15/100,054

(22) PCT Filed: Nov. 28, 2014

(86) PCT No.: PCT/GB2014/053554
§ 371 (c)(1),
(2) Date: May 27, 2016

(87) PCT Pub. No.: WO2015/079263
PCT Pub. Date: Jun. 4, 2015

(65) Prior Publication Data
US 2018/0171076 A1    Jun. 21, 2018

(30) Foreign Application Priority Data
Nov. 28, 2013  (GB) .................................. 1321029.9

(51) Int. Cl.
*C08G 73/02* (2006.01)
*C09K 11/06* (2006.01)
*H01L 51/00* (2006.01)
*H01L 51/50* (2006.01)

(52) U.S. Cl.
CPC .......... *C08G 73/0266* (2013.01); *C09K 11/06* (2013.01); *H01L 51/0043* (2013.01); *H01L 51/506* (2013.01); *H01L 51/5088* (2013.01)

(58) Field of Classification Search
CPC combination set(s) only.
See application file for complete search history.

(56) References Cited

U.S. PATENT DOCUMENTS

| 2013/0270486 | A1  | 10/2013 | Yoshida | |
|---|---|---|---|---|
| 2013/0284985 | A1* | 10/2013 | Yoshida | C07C 211/61 252/500 |
| 2016/0013418 | A1* | 1/2016 | Usui | C09K 11/06 252/500 |

FOREIGN PATENT DOCUMENTS

JP    2013142139 A  *  7/2013

OTHER PUBLICATIONS

Usui et al. "Polyfluorene-polyamines, monomers for them, compositions containing them, organic thin films containing them, and electroluminescent devices using organic thin films" JP 2013-142139A (pub. Jul. 22, 2013). English machine translation obtained from the JPO. (Year: 2013).*
Combined Search and Examination Report dated Jul. 31, 2014 for Application No. GB 1321029.9.
International Search Report and Written Opinion dated Apr. 14, 2015 for Application No. PCT/GB2014/053554.

* cited by examiner

*Primary Examiner* — Amanda L Aguirre
(74) *Attorney, Agent, or Firm* — Wolf, Greenfield & Sacks, P.C.

(57) ABSTRACT

A polymer having a backbone of alternating N atoms and aromatic or heteroaromatic groups including a repeating structure of formula (I) wherein: $R^3$ independently in each occurrence is a substituent; m is 0 or a positive integer; $Ar^1$ and $Ar^2$ are an aryl or heteroaryl group and at least one group selected from $Ar^1$ and $Ar^2$ has formula (II) wherein: each x is independently 0 or a positive integer; each y is independently 0 or a positive integer, and $R^1$ and $R^2$ independently in each occurrence is a substituent.

12 Claims, 2 Drawing Sheets

POLYMERS COMPRISING AMINO DIHYDROPHENANTHRENE REPEATING UNITS AND ORGANIC ELECTRONIC DEVICES USING THE SAME

RELATED APPLICATIONS

This application is a national stage filing under 35 U.S.C. § 371 of international PCT application, PCT/GB2014/053554, filed Nov. 28, 2014, which claims priority to United Kingdom patent application, GB 1321029.9, filed Nov. 28, 2013, each of which is incorporated herein by reference in its entirety.

BACKGROUND OF THE INVENTION

Intrinsically conductive polymers (ICPs) are known for a wide range of applications including use in printed organic circuits and in organic electronic devices such as organic light emitting diodes (OLEDs), organic photoresponsive devices (in particular organic photovoltaic devices and organic photosensors), organic transistors and memory array devices.

An OLED may comprise a substrate carrying an anode, a cathode and one or more organic light-emitting layers between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

Suitable light-emitting materials include small molecule, polymeric and dendrimeric materials. Suitable light-emitting polymers include poly(arylene vinylenes) such as poly(p-phenylene vinylenes) and polyarylenes such as polyfluorenes.

A hole-transporting or hole-injecting layer may be provided between the anode and light-emitting layer of an OLED. WO 2012/131314 discloses a hole-transporting layer of a polymer doped with partially fluorinated fullerene.

WO 2012/086668 discloses polymers comprising repeat units of formula (1):

wherein n1 and n2 are each an integer of 1 to 5. WO 2012/086668 describes formation of these polymers by Suzuki polymerisation, wherein carbon-carbon bonds are formed between aromatic groups of monomers.

US2007/205714 discloses polymers comprising at least 5 mol % of repeat units of the following formula:

wherein X is —CR$^1$=CR$^1$—, C≡C or N—Ar and Y is a divalent aromatic or heteroaromatic ring system having 2 to 40 C atoms.

One method of forming ICPs is the Buchwald-Hartwig polymerisation process in which an aryl dihalide monomer is reacted with a monomer containing primary or secondary arylamines in the presence of a palladium catalyst. In the Buchwald-Hartwig polymerisation process a C—N bond is formed between an aromatic carbon atom of an aromatic monomer and a N atom of an arylamine monomer.

US 2004/262574 discloses a method of forming polymers according to the following general process:

In which Ar$^1$, Ar$^2$, Ar$^3$ and Ar$^4$ are aromatic groups, X$^1$ and X$^2$ are halogens, polymer termini B and C represent a hydrogen or halogen atom, m is an integer of at least 1 and n is an integer of at least 2.

Another method of forming ICPs is Suzuki polymerisation, for example as described in WO 00/53656, WO 03/035796 and U.S. Pat. No. 5,777,070. During Suzuki polymerisation, which takes place in the presence of a palladium catalyst, carbon-carbon bonds form between aromatic carbon atoms of monomers.

SUMMARY OF THE INVENTION

In a first aspect, the invention provides a polymer having a backbone of alternating N atoms and aromatic or heteroaromatic groups including a repeating structure of formula (I):

wherein:
R$^3$ independently in each occurrence is a substituent;
m is 0 or a positive integer;
and Ar$^1$ and Ar$^2$ independently in each occurrence is an aryl or heteroaryl group that may be unsubstituted or substituted with one or more substituents, with the proviso that the repeating structure of formula (I) includes at least one group selected from Ar$^1$ and Ar$^2$ of formula (II):

(II)

wherein:
each x is independently 0 or a positive integer;
each y is independently 0 or a positive integer, and
R¹ and R² independently in each occurrence is a substituent.

In a second aspect the invention provides a method of forming a polymer according to any preceding claim comprising the step of polymerising a monomer of formula M1 and a monomer of formula M2:

wherein X independently in each occurrence is selected from bromine, chlorine, iodine and sulfonic acid esters.

In a second aspect the invention provides an organic electronic device comprising a layer comprising a polymer according to the first aspect.

In a third aspect the invention provides a polymer having a backbone comprising alternating monocyclic or polycyclic aromatic groups and N atoms in the polymer backbone wherein each aromatic group in the polymer backbone is bound directly to a backbone N atom and wherein the polymer is doped with a p-dopant.

The doped polymer of the third aspect preferably contains a repeat unit of formula (I). The doped polymer of the third aspect may contain one or more further repeat units that may or may not include repeat units of formula (II).

In a fourth aspect the invention provides an organic electronic device comprising a layer comprising a doped polymer according to the third aspect.

DESCRIPTION OF THE DRAWINGS

The invention will now be described in more detail with reference to the Figures, in which.

DETAILED DESCRIPTION OF THE INVENTION

Polymers described herein contain alternating amine units and aromatic or heteroaromatic units in the polymer backbone. One or both of Ar¹ of the amine units and the aromatic or heteroaromatic units Ar² contain a group of formula (II).

The group of formula (II) may have formula (IIa):

In an embodiment, m is 0 and Ar² is a group of formula (II).

In an embodiment, m is at least 1, Ar¹ is not a group of formula (II) and Ar² is not a group of formula (II).

In an embodiment, m is 1 and Ar¹ is a group of formula (II), in which case Ar² may or may not be a group of formula (II).

Optionally, at least one x is a positive integer.

Optionally, R¹ in each occurrence is independently selected from:
alkyl wherein one or more non-adjacent C atoms may be replaced with optionally substituted aryl or heteroaryl, O, S, NR¹⁰, C=O or —COO—, and one or more H atoms may be replaced with F wherein R10 is a substituent; and aryl and heteroaryl groups that may be unsubstituted or substituted with one or more substituents; and a crosslinkable group.

Optionally, the group of formula (II) has formula (IIb):

Buchwald Polymerisation

Polymers as described herein may be prepared by the Buchwald polymerisation process, which enables formation of C—N bonds between carbon atoms of an aromatic group and NH groups of amines.

A primary amine (m=0) monomer of formula (M1) may undergo Buchwald polymerisation as illustrated in Reaction Scheme 1, in which a monomer (M2) contains a group of formula (II):

Reaction Scheme 1

A diamine (m=1) monomer of formula (M1) may undergo Buchwald polymerisation as illustrated in Reaction Scheme 2:

Reaction Scheme 2

The polymer may be formed by polymerizing at least one monomer of formula (M1) and at least one monomer of formula (M2) wherein the monomers include at least one of monomer of formula (M1) wherein $Ar^1$ is a group of formula (II) and a monomer of formula (M2) wherein $Ar^2$ is a group of formula (II).

The monomers may include more than one monomer of formula (M1) and more than one monomer of formula (M2). The monomers may include one or more monomers of formula (M1) in which $Ar^1$ is not a group of formula (II), and one or more monomers of formula (M2) in which $Ar^2$ is not a group of formula (II).

The molar ratio of monomers having leaving groups X and amine monomers may be 50:50, and a maximum molecular weight may be achieved using this monomer ratio. The molecular weight of a polymer may be controlled by varying the molar ratio of the monomers, for example by providing a ratio of monomers having leaving groups X and amine monomers of <50:50 or 50:<50.

The polymerisation takes place in the presence of a palladium catalyst. The catalyst may be a palladium (0) or palladium (II) catalyst.

The catalyst may comprise phosphine ligands $PR^5_3$ wherein each $R^5$ is independently $C_{1-10}$ alkyl or an aryl group. An exemplary aryl $R^5$ group is phenyl. Aryl $R^5$ groups may be unsubstituted or substituted with one or more substituents, for example one or more $C_{1-10}$ alkyl or alkoxy groups. The catalyst may be provided in the reaction mixture as a preformed catalyst having phosphine ligands bound to the palladium metal, or a Pd (0) or Pd(II) compound may be mixed with the phosphine ligands.

The reaction may take place in the presence of a base. Suitable bases include inorganic and organic bases, for example hydroxides, alkoxides, carbonates and hydrogen carbonates of a metal or $NR^{4+}$ wherein $R^4$ in each occurrence is H or a hydrocarbyl, optionally a $C_{1-10}$ alkyl.

The polymerisation reaction may take place in a single organic liquid phase in which all components of the reaction mixture are dissolved, or in which one ore more components are suspended.

The polymer may be end-capped by addition of an endcapping reactant. Suitable end-capping reactants are aromatic or heteroaromatic materials substituted with only one group X or substituted with an amine having only one N—H bond. End-capping reactants may be added during or at the end of the polymerisation reaction.

It will be understood that all aromatic or heteroaromatic groups in the polymer backbone are bound directly to N atoms in the polymer backbone; the polymer backbone does not contain aromatic or heteroaromatic groups bound directly to each other.

The high amine content of polymers formed by Buchwald polymerisation may provide high hole conductivity.

The polystyrene-equivalent number-average molecular weight (Mn) measured by gel permeation chromatography of the polymers described herein may be in the range of about $1\times10^3$ to $1\times10^8$, and preferably $1\times10^4$ to $5\times10^6$. The polystyrene-equivalent weight-average molecular weight (Mw) of the polymers described herein may be $1\times10^3$ to $1\times10^8$, and preferably $1\times10^4$ to $1\times10^7$.

Monomer M2

Exemplary monomers M2 in which $Ar^2$ is not a group of formula (II) include the following:

wherein q in each occurrence is 0, 1, 2, 3 or 4; d in each occurrence is 0, 1, 2 or 3; $R^6$ independently in each occurrence is a substituent and two groups $R^6$ may be linked to form a substituted or unsubstituted ring; p is 1-20; $R^8$ independently in each occurrence is a substituent; and X is as described above.

$R^6$ and $R^8$ may independently in each occurrence be selected from the group consisting of:

alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;

aryl and heteroaryl groups that may be unsubstituted or substituted with one or more substituents, preferably phenyl substituted with one or more $C_{1-20}$ alkyl groups;

a linear or branched chain of aryl or heteroaryl groups, each of which groups may independently be substituted, for example a group of formula —$(Ar^5)_r$ wherein each $Ar^5$ is independently an aryl or heteroaryl group and r is at least 2, preferably a branched or linear chain of phenyl groups each of which may be unsubstituted or substituted with one or more $C_{1-20}$ alkyl groups; and a crosslinkable-group, for example a group comprising a double bond such and a vinyl or acrylate group, or a benzocyclobutane group.

In the case where $R^6$ or $R^8$ comprises an aryl or heteroaryl group, or a linear or branched chain of aryl or heteroaryl groups, the or each aryl or heteroaryl group may be substituted with one or more substituents $R^7$ selected from the group consisting of:

alkyl, for example $C_{1-20}$ alkyl, wherein one or more non-adjacent C atoms may be replaced with O, S, substituted N, C=O and —COO— and one or more H atoms of the alkyl group may be replaced with F;

$NR^9_2$, $OR^9$, $SR^9$, $SiR^9_3$ and fluorine, nitro and cyano;

wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^9$— wherein $R^9$ is as described above.

Preferably, each $R^6$ and, where present, $R^8$ is independently selected from $C_{1-40}$ hydrocarbyl, and is more preferably selected from $C_{1-20}$ alkyl; unsubstituted phenyl; phenyl substituted with one or more $C_{1-20}$ alkyl groups; a linear or branched chain of phenyl groups, wherein each phenyl may be unsubstituted or substituted with one or more $C_{1-20}$ alkyl groups; and a crosslinkable group.

Crosslinkable substituents as described anywhere herein including, without limitation, crosslinkable groups $R^1$, $R^6$ and $R^8$, may be selected from groups of the following formulae:

wherein Sp is a spacer group; t is 0 or 1; $R^{10}$ in each occurrence is H, $C_{1-10}$ alkyl or $C_{1-10}$ alkoxy; $R^{11}$ is H or $C_{1-10}$ alkyl; and * represents a point of attachment of the crosslinkable substituent to the monomer. Exemplary spacer groups are $C_{1-20}$ alkyl, phenyl and phenyl-$C_{1-20}$ alkyl. One or more C atoms of an alkyl of a spacer group Sp may be replaced with O or S.

Monomer M1

$Ar^1$ of the repeating structure of formula (I) may be a group of formula (II) or may be a different group, for example a monocyclic or polycyclic aryl group that is unsubstituted or substituted with one or more substituents, for example unsubstituted or substituted phenylene, naphthalene, anthracene and fluorene, optionally a group of formula (IIIa) or (IIIb):

wherein $R^8$, $R^6$ and d are as described above.

In the repeating structure of formula (I) $R^3$, which may be the same or different in each occurrence when m>1, is preferably selected from the group consisting of alkyl, for example $C_{1-20}$ alkyl, $Ar^7$, a branched or linear chain of $Ar^7$ groups, or a crosslinkable substituent, wherein $Ar^7$ in each occurrence is independently optionally substituted aryl or heteroaryl. Optionally, $Ar^7$ is phenyl that may be unsubstituted or substituted with one or more $C_{1-20}$ alkyl groups.

Any of $Ar^1$ and, if present, $Ar^7$ in the repeat unit of Formula (II) may be linked by a direct bond or a divalent linking atom or group to another of $Ar^1$ and $Ar^7$. Preferred divalent linking atoms and groups include O, S; substituted N; and substituted C.

$Ar^7$ may be substituted with one or more substituents. Exemplary substituents are substituents $R^{12}$, wherein each $R^{12}$ may independently be selected from the group consisting of:
  substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F; and
  a crosslinkable group Exemplary monomers of formula (M1) include the following:

wherein u is 0, 1, 2, 3, 4 or 5.

Doped Polymers

Polymers as described herein may be undoped or may be doped by a p-dopant. Exemplary p-dopants include partially fluorinated fullerenes; TCNQ and fluorinated TCNQ, for example F4TCNQ; HAT-CN, $F_6CNNQ$, $MO_3$ and electron-poor radialenes.

Exemplary fluorinated fullerenes have formula $C_AF_B$, wherein B is in the range of 10-60 and A is more than B, optionally 60 or 70. Examples include $C_{60}F_{18}$, $C_{60}F_{20}$, $C_{60}F_{36}$, $C_{60}F_{48}$, $C_{70}F_{44}$, $C_{70}F_{46}$, $C_{70}F_{48}$, and $C_{70}F_{54}$.

The doped polymer may be an extrinsic or degenerate semiconductor.

A doped polymer of the third aspect of the invention may contain a repeat unit of formula (I), and may or may not contain a repeat unit of formula (II). Preferably, a doped polymer contains a repeat unit of formula (I) and one or more arylene repeat units wherein the arylene repeat units are each independently unsubstituted or substituted with one or more substituents. Arylene repeat units may be selected from the group of repeat units of formula (II) and repeat units formed by polymerisation of monomers M2.

Applications

Polymers as described herein may be used in a wide range of applications including, without limitation, printed organic circuits and in organic electronic devices such as organic light emitting diodes (OLEDs), organic photoresponsive devices (in particular organic photovoltaic devices and organic photosensors), organic transistors and memory array devices.

Figure 1:
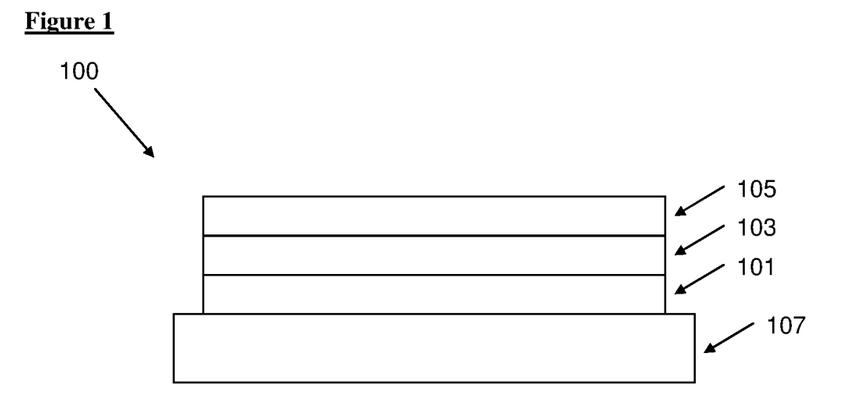
FIG. 1 is a schematic illustration of an OLED according to an embodiment of the invention.

FIG. 1, which is not drawn to any scale, illustrates schematically an OLED 100 according to an embodiment of the invention. The OLED 100 is carried on substrate 107 and comprises an anode 101, a cathode 105 and a light-emitting layer 103 between the anode and the cathode. Further layers (not shown) may be provided between the anode and the cathode including, without limitation, charge-transporting layers, charge-blocking layers and charge injection layers. The device may contain more than one light-emitting layer.

Exemplary OLED structures including one or more further layers include the following:
  Anode/Hole-injection layer/Light-emitting layer/Cathode
  Anode/Hole transporting layer/Light-emitting layer/Cathode
  Anode/Hole-injection layer/Hole-transporting layer/Light-emitting layer/Cathode
  Anode/Hole-injection layer/Hole-transporting layer/Light-emitting layer/Electron-transporting layer/Cathode.

A polymer as described herein may have a HOMO level in the range of about 5.7-4.8 eV, preferably 5.3-4.9 eV as measured by cyclic voltammetry.

A polymer as described herein may be provided in a hole-transporting layer or light-emitting layer of an OLED.

A doped polymer as described herein may be provided in a hole-injection layer of an OLED.

A layer containing a polymer as described herein may consist essentially of the doped or undoped polymer, or may contain one or more further components. For example, the polymer may be used in a light-emitting layer as a host for a fluorescent or phosphorescent light-emitting dopant.

A film or pattern of the polymer may be applied on a surface by applying a formulation containing the polymer dispersed or dissolved in one or more solvents, followed by evaporation of the solvent or solvents. Suitable deposition methods include coating and printing methods. Coating methods include spin-coating, dip-coating, roller coating and doctor blade coating. Printing methods include flexographic printing and inkjet printing.

The polymer may be provided with crosslinkable groups as described herein. Following evaporation of the solvent or solvents of a formulation, the crosslinkable groups may be crosslinked to form a crosslinked layer that does not dissolve when a further formulation is deposited over the crosslinked layer.

Light-Emitting Layer

An OLED may contain one or more light-emitting layers. A light-emitting layer may contain a polymer as described herein.

Suitable light-emitting materials for a light-emitting layer include polymeric, small molecule and dendrimeric light-emitting materials, each of which may be fluorescent or phosphorescent.

A light-emitting layer of an OLED may be unpatterned, or may be patterned to form discrete pixels. Each pixel may be further divided into subpixels. The light-emitting layer may contain a single light-emitting material, for example for a monochrome display or other monochrome device, or may contain materials emitting different colours, in particular red, green and blue light-emitting materials for a full-colour display.

A light-emitting layer may contain a mixture of more than one light-emitting material, for example a mixture of light-emitting materials that together provide white light emission.

A blue light emitting material may have a photoluminescent spectrum with a peak in the range of 400-490 nm.

A green light emitting material may have a photoluminescent spectrum with a peak in the range of more than 490 nm up to 580 nm.

A red light emitting material may optionally have a peak in its photoluminescent spectrum of more than 580 nm up to 650 nm, preferably 600-630 nm.

Exemplary polymeric light-emitting materials include polymers comprising one or more of arylene repeat units, arylene vinylene repeat units and arylamine repeat units.

Exemplary phosphorescent light-emitting materials include metal complexes comprising substituted or unsubstituted complexes of formula (IX):

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet or higher states. Suitable heavy metals M include d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Exemplary ligands $L^1$, $L^2$ and $L^3$ include carbon or nitrogen donors such as porphyrin or bidentate ligands of formula (X):

wherein $Ar^5$ and $Ar^6$ may be the same or different and are independently selected from substituted or unsubstituted aryl or heteroaryl; $X^1$ and $Y^1$ may be the same or different and are independently selected from carbon or nitrogen; and $Ar^5$ and $Ar^6$ may be fused together. Ligands wherein $X^1$ is carbon and $Y^1$ is nitrogen are preferred, in particular ligands in which $Ar^5$ is a single ring or fused heteroaromatic of N and C atoms only, for example pyridyl or isoquinoline, and $Ar^6$ is a single ring or fused aromatic, for example phenyl or naphthyl.

Examples of bidentate ligands are illustrated below:

Each of $Ar^5$ and $Ar^6$ may carry one or more substituents. Two or more of these substituents may be linked to form a ring, for example an aromatic ring.

Other ligands suitable for use with d-block elements include diketonates, in particular acetylacetonate (acac); triarylphosphines and pyridine, each of which may be substituted.

Exemplary substituents of $Ar^5$ and $Ar^6$ are $C_{1-40}$ hydrocarbyl groups.

Cathode

The cathode of an OLED is selected from materials that have a workfunction allowing injection of electrons into the light-emitting layer. Other factors influence the selection of the cathode such as the possibility of adverse interactions between the cathode and the light-emitting material. The cathode may consist of a single material such as a layer of aluminium. Alternatively, it may comprise a plurality of metals, for example a bilayer of a low workfunction material and a high workfunction material such as calcium and aluminium as disclosed in WO 98/10621. The cathode may contain a layer of elemental barium as disclosed in WO 98/57381, Appl. Phys. Lett. 2002, 81(4), 634 and WO 02/84759. The cathode may contain a thin (e.g. 1-5 nm thick) layer of metal compound between the light-emitting layer(s) of the OLED and one or more conductive cathode layers, for example one or more metal layers, to assist electron injection. Metal compounds include, in particular, an oxide or fluoride of an alkali or alkali earth metal, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm A getter material for absorption of any atmospheric moisture and/or oxygen that may permeate through the substrate or encapsulant may be disposed between the substrate and the encapsulant.

EXAMPLES

Polymer Examples

Polymers were prepared by Buchwald polymerisation of Monomers 1-6 in the amounts set out in Table 1.

Monomer 1

Monomer 2

Monomer 3

Monomer 4

Monomer 5

Monomer 6

-continued

Monomer 7

Monomer 8

Polymer Example 1 and Comparative Polymers 1-3

To prepare Polymer Example 1, a flask was charged with monomer 1 (2.0552 g, 3.0 mmol), monomer 2 (0.4011 g, 0.6 mmol), monomer 3 (1.4749 g, 2.4 mmol) and xylene (40 mL). The solution was degassed for 0.5 h before tris (dibenzylideneacetone) dipalladium (0.0549 g, 0.06 mmol), tri-tert-butyl phosphonium tetrafluoroborate (0.0348 g, 0.12 mmol) and sodium tert-butoxide (1.15 g, 12.0 mmol) were added with a further 10 mL degassed xylene. The mixture was stirred at a temperature of 115° C. for 72 h. N,N-Ditolylamine (0.059 g, 0.3 mmol), tris(dibenzylideneacetone) dipalladium (0.0137 g, 0.015 mmol), tri-tert-butyl phosphonium tetrafluoroborate (0.0087 g, 0.03 mmol) and sodium tert-butoxide (0.29 g, 3.0 mmol) were added with a further 15 mL degassed xylene. The mixture was stirred at 115° C. for a further 24 h. 4-Bromotoluene (0.067 g, 0.3 mmol), tris(dibenzylideneacetone) dipalladium (0.0137 g, 0.015 mmol), tri-tert-butyl phosphonium tetrafluoroborate (0.0087 g, 0.03 mmol) and sodium tert-butoxide (0.29 g, 3.0 mmol) were added with a further 15 mL degassed xylene. The mixture was stirred at 115° C. for a further 24 h before being allowed to cool to room temperature The cooled mixture was passed through a plug of celite 545 on Florisil® on silica and eluted with toluene. The filtrate was concentrated to ~40 mL and then stirred at 85° C. with an aqueous solution of diethyldithiocarbamic acid sodium salt for 2 h. After cooling the layers are separated and the organic layer was washed five times with water before precipitating into methanol. The recovered polymer fibres were redissolved in toluene and filtered through a plug of celite 545 on Florisil® or silica and eluting with toluene. The filtrate was concentrated to ~40 mL and filtered before precipitating into methanol. The recovered polymer fibres were dried in the vacuum oven overnight to give 2.99 g product.

Comparative Polymers 1-3 were prepared by the same process using monomer amounts as set out in Table 2.

TABLE 2

| Polymer | Monomer 1/g | Monomer 2/g | Monomer (x)/g | Yield/g |
| --- | --- | --- | --- | --- |
| Polymer 1 | 2.0552 | 0.4011 | (3) 1.4749 | 2.99 |
| Comparative Polymer 1 | 2.0552 | 0.4011 | (4) 1.6335 | 0.81 |
| Comparative Polymer 2 | 2.0552 | 0.4011 | (5) 1.3451 | 1.53 |
| Comparative Polymer 3 | 2.0552 | 0.4011 | (6) 1.9121 | 0.39 |

TABLE 1

| Polymer | Diamine monomer (mol %) | Monomer 2 (mol %) | Further monomer (mol %) | Mw | Mp | Mn |
| --- | --- | --- | --- | --- | --- | --- |
| Polymer Example 1 | Monomer 1 (50) | 10 | Monomer 3 (40) | 146,000 | 151,000 | 27,000 |
| Comparative Polymer 1 | Monomer 1 (50) | 10 | Monomer 4 (40) | 201,000 | 197,000 | 30,000 |
| Comparative Polymer 2 | Monomer 1 (50) | 10 | Monomer 5 (40) | 46,000 | 52,000 | 14,000 |
| Comparative Polymer 3 | Monomer 1 (50) | 10 | Monomer 6 (40) | 178,000 | 183,000 | 36,000 |
| Polymer Example 2 | Monomer 7 (50) | 10 | Monomer 3 (40) | 258,000 | 254,000 | 21,000 |
| Comparative Polymer 4 | Monomer 8 (50) | 10 | Monomer 4 (40) | 198,000 | 160,000 | 26,000 |
| Polymer Example 3 | Monomer 8 (50) | 10 | Monomer 3 (40) | 173,000 | 135,000 | 21,000 |

Polymer Examples 2 and 3 and Comparative Polymer 4

To prepare Polymer Example 2, a flask was charged with monomer 7 (1.6733 g, 2.2275 mmol), monomer 2 (0.3008 g, 0.45 mmol), monomer 3 (1.1062 g, 1.8 mmol) and xylene (30 mL). The solution was degassed for 0.5 h before palladium dichloride bis(bis-tert-butylphenylphosphine) (0.014 g, 0.0225 mmol) and sodium tert-butoxide (0.86 g, 8.5 mmol) were added with a further 7.5 mL degassed xylene. The mixture was stirred at a temperature of 115° C. for ~4 h. N,N-Ditolylamine (0.045 g, 0.229 mmol), palladium dichloride bis(bis-tert-butylphenylphosphine) (0.007 g, 0.011 mmol) and sodium tert-butoxide (0.22 g, 2.28 mmol) were added with a further 7.5 mL degassed xylene. The mixture was stirred at 115° C. for a further 14 h before being allowed to cool to room temperature The cooled mixture was passed through a plug of celite 545 on Florisil® on silica and eluted with toluene. The filtrate was concentrated to ~40 mL and then stirred at 85° C. with an aqueous solution of diethyldithiocarbamic acid sodium salt for 2 h. After cooling the layers are separated and the organic layer was washed five times with water before precipitating into methanol. The recovered polymer fibres were redissolved in toluene and filtered through a plug of celite 545 on Florisil® or silica and eluting with toluene. The filtrate was concentrated to ~40 mL and filtered before precipitating into methanol. The recovered polymer fibres were dried in the vacuum oven overnight.

Comparative Polymer 4 and Polymer Example 3 were prepared by the same process using monomer amounts as set out in Table 3.

TABLE 3

| Polymer | Monomer (x)/g | Monomer 2/g | Monomer (y)/g | Yield/g |
|---|---|---|---|---|
| Polymer 2 | (7) 1.6733 | 0.3008 | (3) 1.1062 | 2.19 |
| Comparative Polymer 4 | (8) 1.3653 | 0.3008 | (4) 1.2251 | 1.48 |
| Polymer 3 | (8) 1.3653 | 0.3008 | (3) 1.1062 | 1.43 |

Device Examples

1) Use as a Hole-Transporting Layer

Polymer Example 1 and Comparative Polymers 1-3 were used to form a hole-transporting layer of OLED Example 1 and Comparative OLEDs 1-3 respectively of an OLED having the following structure:

ITO/HIL/HTL/LE/Cathode wherein ITO is an indium-tin oxide anode; HIL is a hole-injecting layer; HTL is the hole-transporting layer; LE is a light-emitting layer; and the cathode comprises a layer of metal fluoride in contact with the light-emitting layer and an overlying bilayer of aluminium and silver.

To form the device, a substrate carrying ITO was cleaned using UV/Ozone. The hole injection layer was formed by spin-coating an aqueous formulation of a hole-injection material available from Plextronics, Inc. A polymer described in Table 1 was formed to a thickness of 22 nm by spin-coating, followed by crosslinking of the polymer by heating to form the hole-transporting layer. A light-emitting layer was formed by spin-coating a mixture of Blue Polymer 1 and Additive Polymer 1 (90:10 w/w). A cathode was formed by evaporation of a first layer of a metal fluoride to a thickness of about 2 nm, a second layer of aluminium to a thickness of about 200 nm and a third layer of silver.

Figure 2:
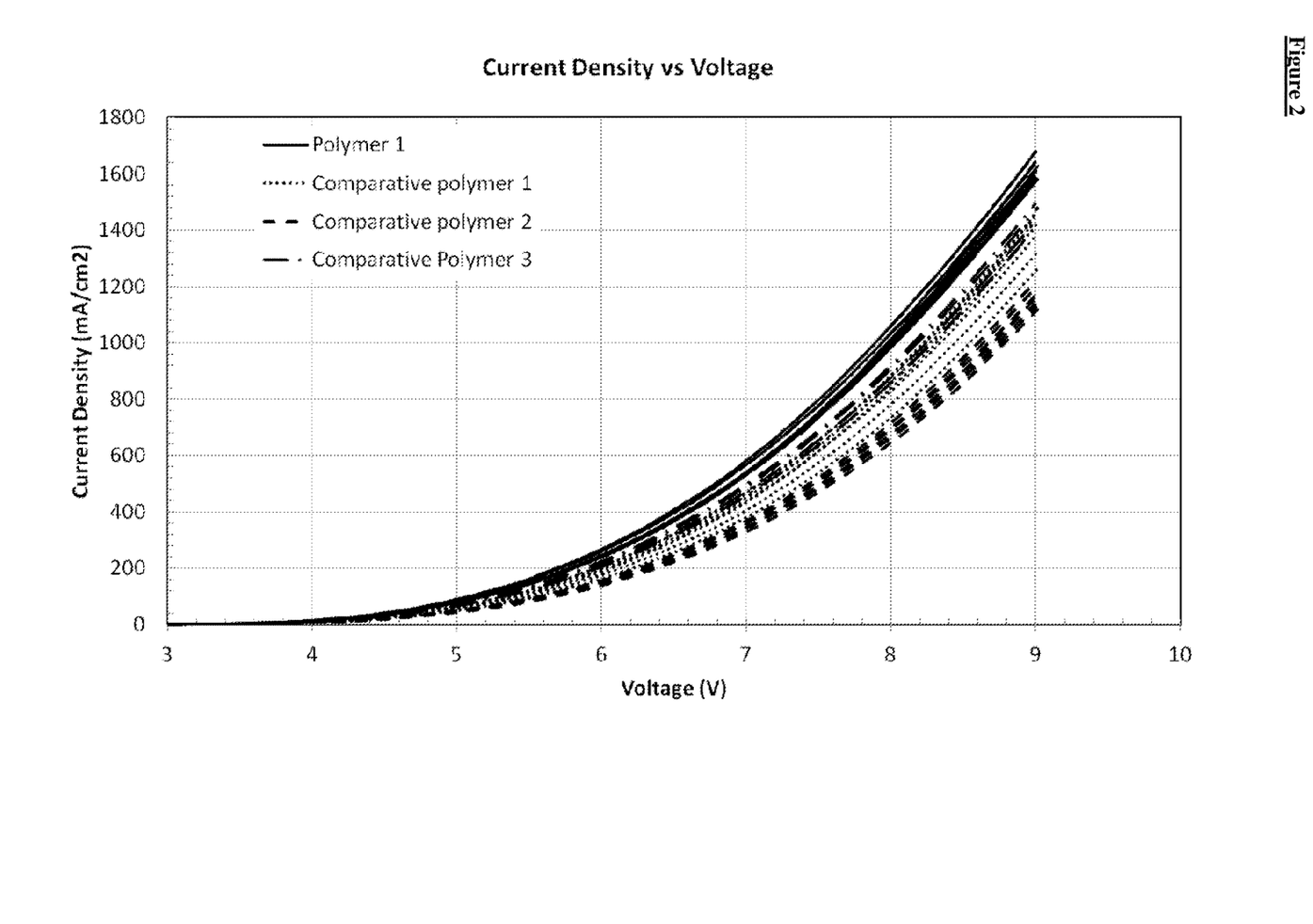
FIG. 2 is a graph of current density vs. voltage for an OLED according to an embodiment of the invention and comparative OLEDs.

With reference to FIG. 2, the current density for OLED Example 1 is higher than that of any of the comparative OLEDs.

Blue Polymer 1 was formed by Suzuki polymerization as described in WO 00/53656 of the following monomers:

Additive Polymer 1 was formed by Suzuki polymerization as described in WO 00/53656 of the following monomers:

50 mol %

50 mol %

2) Hole-Only Devices

Hole-only devices having the following structure were prepared:

ITO/HIL/HTL/Cathode wherein ITO is an indium-tin oxide anode; HIL is a hole-injecting layer; HTL is the hole-transporting layer; and the cathode is formed from a layer of aluminium in contact with HTL and a layer of silver in contact with the aluminium layer.

To form the device, a substrate carrying ITO was cleaned using UV/Ozone. The hole injection layer was formed to a thickness of 35 nm by spin-coating an aqueous formulation of a hole-injection material available from Plextronics, Inc. and heating the resultant layer at 170° C. for 15 minutes. A polymer described in Table 2 was formed to a thickness of 60 nm by spin-coating, followed by crosslinking of the polymer by heating at 180° C. for 60 minutes to form the hole-transporting layer. The cathode was formed by evaporation of a first layer of aluminium to a thickness of about 100 nm and a second layer of silver to a thickness of about 100 nm.

TABLE 4

| Polymer | $Ar^1$ of formula (II) | $Ar^2$ of formula (II) | Voltage at 10 mA $cm^{-2}$ (V) | Voltage at 100 mA $cm^{-2}$ (V) |
|---|---|---|---|---|
| Comparative Polymer 1 | N | N | 1.4 | 2.5 |
| Comparative Polymer 3 | N | N | 1.9 | 3.3 |
| Polymer Example 1 | N | Y | 1.3 | 2.5 |
| Polymer Example 2 | Y | Y | 1.3 | 2.3 |

In Polymer Example 1, $Ar^2$ of formula (I) is a group of formula (II). In Comparative Polymers 1 and 3 this group $Ar^2$ is replaced with a fluorene group.

The hole-only device containing Polymer Example 1 reached a current density of 10 mA $cm^{-2}$ at a lower voltage than either Comparative Polymer 1 or Comparative Polymer 3.

Polymer Example 2, in which both $Ar^1$ and $Ar^2$ of formula (I) are a group of formula (II), shows a decrease in drive voltage required to reach a current density of 10 mA $cm^{-2}$ and 100 mA $cm^{-2}$ as compared to both Comparative Polymer 1 and Comparative Polymer 3.

2) Use as a Doped Hole-Injection Layer

Doped polymers were used to form a hole-injection layer (HIL) of an OLED having the following structure:

ITO/HIL (35 nm)/HTL (22 nm)/LE (65 nm)/Cathode wherein ITO, HIL, HTL, LE and Cathode were formed as described above, and wherein:

HIL was formed by spin-coating either doped Polymer Example 1 or doped Comparative Polymer 1;

HTL was formed by spin-coating Hole-Transporting Polymer 1; and

LE was formed by spin-coating a mixture of Blue Polymer 1 and Additive Polymer 1 in a 9:1 weight ratio, as described with reference to hole-transporting layer examples.

The doped polymers used to form the HILs were formed by p-doping the polymer with either 50 weight % of dopant NDP-9 available from Novaled AG or 15 weight % of partially-doped fullerene $C_{60}F_{36}$.

Hole-Transporting Polymer 1 was formed by Suzuki polymerisation of the following monomers as described in WO 00/53656:

7.5%

Drive voltage at a current density of 10 mA cm$^{-2}$ is shown in Table 5.

TABLE 5

| Device | HIL polymer | HIL polymer dopant (wt %) | External Quantum Efficiency (%) |
|---|---|---|---|
| Device Example 4 | Polymer Example 1 | NDP-9 (50) | 6.4 |
| Comparative Device 4 | Comparative Polymer 1 | NDP-9 (50) | 6.1 |
| Device Example 5 | Polymer Example 1 | C$_{60}$F$_{36}$ (15) | 5.8 |

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A polymer having a backbone of alternating N atoms and aromatic or heteroaromatic groups including a repeating structure of formula (I):

(I)

wherein:
R$^3$ independently in each occurrence is a substituent;
m is at least 1;
Ar$^1$ independently in each occurrence is selected from groups of formula (IIIa) and (IIIb):

(IIIa)

(IIIb)

wherein each R$^6$ and R$^8$ is independently a substituent and d is 0 or a positive integer;

and Ar$^2$ is a group of formula (II):

(II)

wherein:
each x is independently 0 or a positive integer;
each y is independently 0 or a positive integer, and
R$^1$ and R$^2$ independently in each occurrence is a substituent.

2. The polymer according to claim 1, wherein the group of formula (II) has formula (IIa):

(IIa)

3. The polymer according to claim 1, wherein at least one x is a positive integer.

4. The polymer according to claim 3, wherein R$^1$ in each occurrence is independently selected from:
alkyl wherein one or more non-adjacent C atoms may be replaced with optionally substituted aryl or heteroaryl, O, S, NR$^{10}$, C=O or —COO—, and one or more H atoms may be replaced with F wherein R$^{10}$ is a substituent; and
aryl and heteroaryl groups that may be unsubstituted or substituted with one or more substituents.

5. The polymer according to claim 1, wherein each R$^3$ is independently aryl or heteroaryl that may be unsubstituted or substituted with one or more substituents.

6. The polymer according to claim 1, wherein the group of formula (II) has formula (IIb):

(IIb)

7. The polymer according to claim 1, wherein the polymer is doped.

8. A method of forming a polymer according to claim 1, comprising the step of polymerising a monomer of formula M1 and a monomer of formula M2:

(M1)

X—Ar²—X  (M2)

wherein X independently in each occurrence is selected from bromine, chlorine, iodine and sulfonic acid esters.

9. An organic electronic device comprising a layer comprising a polymer according to claim 1.

10. The organic electronic device according to claim 9, wherein the organic electronic device is an organic light-emitting device comprising an anode, a cathode and a light-emitting layer between the anode and the cathode.

11. The organic electronic device according to claim 10, wherein a hole-transporting layer comprising said polymer is provided between the anode and the light-emitting layer.

12. The organic electronic device according to claim 10, wherein a hole-injecting layer comprising said polymer is doped, and is provided between the anode and the light-emitting layer.

* * * * *